(12) United States Patent
Yang et al.

(10) Patent No.: US 10,469,086 B2
(45) Date of Patent: Nov. 5, 2019

(54) LEVEL-SHIFTER CIRCUITS AND METHODS OF USING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Chia Chi Yang, Shanghai (CN); Jun Tao Guo, Shanghai (CN); Chen Yi Huang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/872,230

(22) Filed: Jan. 16, 2018

(65) Prior Publication Data

US 2018/0205379 A1    Jul. 19, 2018

(30) Foreign Application Priority Data

Jan. 16, 2017   (CN) .......................... 2017 1 0030675

(51) Int. Cl.
*H03K 19/0185*   (2006.01)
*H03K 3/356*     (2006.01)
*H03K 3/3562*    (2006.01)

(52) U.S. Cl.
CPC ..... *H03K 19/018521* (2013.01); *H03K 3/356* (2013.01); *H03K 3/35613* (2013.01); *H03K 3/35625* (2013.01); *H03K 19/018528* (2013.01)

(58) Field of Classification Search
None
See application file for complete search history.

(56) References Cited

U.S. PATENT DOCUMENTS

| | | | | |
|---|---|---|---|---|
| 6,741,230 B2* | 5/2004 | Sakai | ............... | H03K 3/356113 326/62 |
| 6,954,100 B2* | 10/2005 | Dharne | ............ | H03K 3/356113 326/80 |
| 7,005,908 B2* | 2/2006 | Lee | .................. | H03K 3/356113 327/333 |
| 7,443,223 B2* | 10/2008 | Bajkowski | ........ | H03K 3/356121 326/68 |
| 7,642,834 B2* | 1/2010 | Chiou | .................... | G11C 19/00 327/333 |
| 8,378,728 B1* | 2/2013 | Goyal | ................ | H03K 3/35625 326/80 |
| 9,531,365 B1* | 12/2016 | Shon | .................... | H03K 5/1565 |

* cited by examiner

*Primary Examiner* — Minh D A
*Assistant Examiner* — James H Cho
(74) *Attorney, Agent, or Firm* — Anova Law Group, PLLC

(57) ABSTRACT

Level-shifter circuits and methods of using the same are provided. A level-shifter circuit includes a latch unit and a level-shifting unit. The latch unit is configured to generate a latch signal for storing a logic state of a first digital signal in a first power supply domain. The level-shifting unit is configured to shift a voltage of the latch signal to output a second digital signal in a second power supply domain. The latch unit and the level-shifting unit are powered by a power supply voltage in the second power supply domain.

18 Claims, 5 Drawing Sheets

US 10,469,086 B2

LEVEL-SHIFTER CIRCUITS AND METHODS OF USING THE SAME

CROSS-REFERENCES TO RELATED APPLICATION

This application claims the priority of Chinese Patent Application No. 201710030675.4, filed on Jan. 16, 2017, the content of which is incorporated by reference in its entirety.

TECHNICAL FIELD

The present disclosure generally relates to the field of electronic circuit design and, more particularly, relates to level-shifter circuits and methods of using the same.

BACKGROUND

With the introduction of low-voltage logic in the electronic circuit design, the inconsistent voltage between the input and output logic signals with the domains adds the complexity of system design. For example, when a digital circuit with 1.8V power supply is configured to communicate with an analog circuit with 3.3V power supply, level-shifter circuits are commonly used to change the voltage of the signals to be consistent. Level-shifter circuits are also essential between digital circuits with different logic signal voltage levels (e.g. TTL and CMOS). Level-shifter circuits are also used in low-power devices, such as internet of things (IOT) device, wearable device, and the like. Because low-power devices are sensitive to circuit power consumption, the power requirements for level-shifter circuits are also critical.

FIG. 1 shows a conventional level-shifter circuit 100. The level-shifter circuit 100 includes a first inverter (not labelled, see PMOS transistor P1 and NMOS transistor N1), a NMOS transistor N2, a second inverter (not labelled, see PMOS transistor P4 and NMOS transistor N3), a NMOS transistor N5, and a cross-coupled PMOS transistor P2 and a PMOS transistor P3. An input terminal of the first inverter receives a first digital signal (In). The first inverter and the second inverter are powered by a power supply voltage (e.g., 1.2 V) in a first power supply domain. The level-shifter circuit 100 shifts the voltage level of the first digital signal (In) to an appropriate range in a second power supply domain (for example, a supply voltage of 2.5 V), and then outputs a second digital signal (Out). The second digital signal (Out) is outputted through the drain of the PMOS transistor P2.

When the power supply voltage of the first power supply domain is powered off, the power supply voltage of the first inverter and the second inverter is switched off. Thus, the output terminals of the first inverter and the second inverter are at a floating status with respect to a ground reference. That is, the logic levels of their outputs are uncertain. In such situation, the NMOS transistor N2 and the NMOS transistor N5, which are cascaded with the first inverter and the second inverter, may be simultaneously turned on. The PMOS transistor P2 and the PMOS transistor P3 may be also simultaneously on because the voltage level of their gate terminals is equal to the ground reference voltage. Therefore, a leakage current in the second power domain can be generated through the PMOS transistor P2 and the NMOS transistor N2, or through the PMOS transistor P3 and the NMOS transistor N5, to the ground.

The above-described leakage current causes additional power consumption in the level-shifter circuit 100, which is unacceptable especially for a low-power consumption device.

The disclosed circuits are directed to at least partially alleviate one or more problems set forth above and to solve other problems in the art.

SUMMARY

One aspect of the present disclosure provides a level-shifter circuit. The level-shifter circuit includes a latch unit and a level-shifting unit. The latch unit is configured to generate a latch signal for storing a logic state of a first digital signal in a first power supply domain. The level-shifting unit is configured to shift a voltage of the latch signal to output a second digital signal in a second power supply domain. The latch unit and the level-shifting unit are powered by a power supply voltage in the second power supply domain.

Another aspect of the present disclosure provides a method for using a level-shifter circuit. In the method, a latch unit generates a latch signal to store a logic state of a first digital signal in a first power supply domain. A level-shifting unit shifts a voltage of the latch signal to output a second digital signal in a second power supply domain. The latch unit and the level-shifting unit are powered by a power supply voltage in a second power supply domain.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Leakage current may be generated in level-shifter circuits, resulting in unnecessary power consumption, which is particularly non-negligible for low-power devices.

Figure 1:
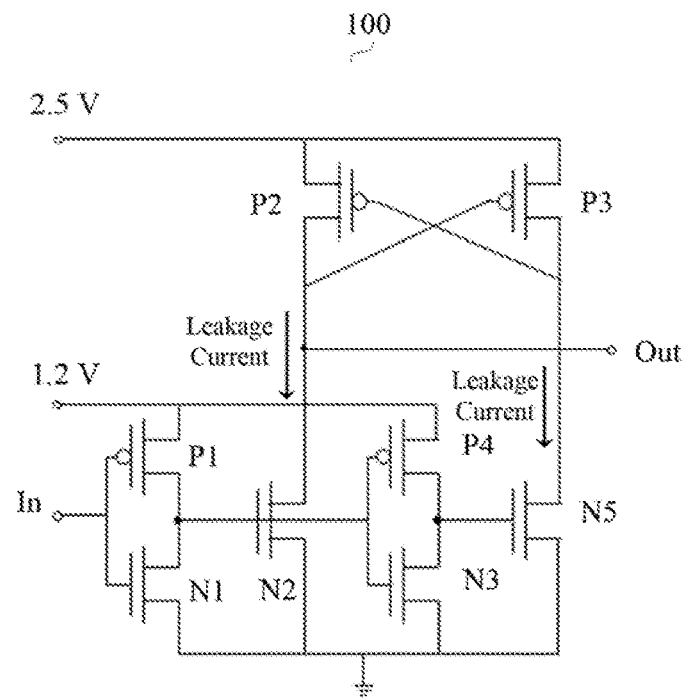
FIG. 1 is a circuit diagram of a conventional level-shifter circuit.
Figure 2:
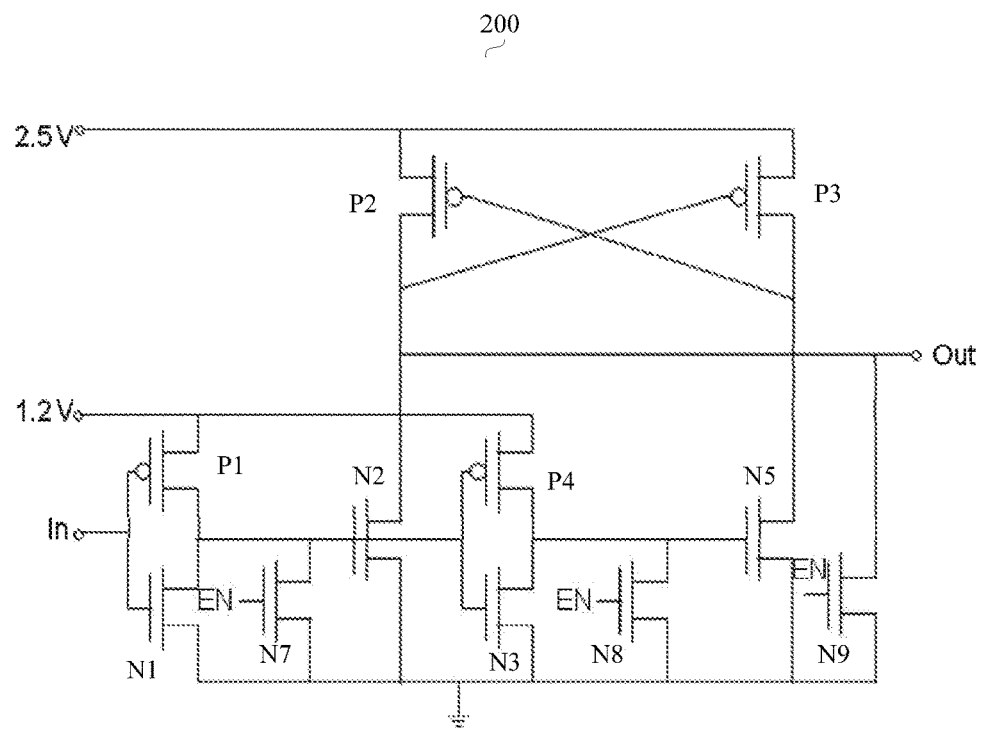
FIG. 2 is a circuit diagram of another conventional level-shifter circuit.

FIG. 2 is a circuit diagram of a level-shifter circuit 200. As shown, level-shifter circuit 200 further includes three additional NMOS transistors N7, N8, and N9, based on the level-shifter circuit 100 shown in FIG. 1. The gate terminals of N7, N8, and N9 may receive an enable signal (EN). On or before the power supply voltage of the first power supply domain is powered off, the level-shifter circuit 200 pull the enable signal (EN) high to turn on the NMOS transistors N7, N8, and N9. The NMOS transistors N2 and N5 are correspondingly turned off to cut off the possible paths of the leakage current. However, the level-shifter circuit 200 has a very stringent requirement on the timing of setting the enable signal (EN) high. If setting the enable signal (EN) after the power supply has been turned off, the leakage current may have occurred during the time period from the completion of the power-off action to the completion of the enable action. If setting the enable signal (EN) too early, the operation of the level-shifter circuit 200 may be affected. Therefore, the level-shifter circuit 200 may fail or still have leakage current due to an erroneous control of timing sequence. The level-shifter circuit 200 may be less practical.

In other low-leakage level-shifter circuits that use an enable signal to avoid the current leakage during the level-shifting, an internal enable signal generating circuit may be used to detect a power supply voltage of a power domain in which an input signal exists. When an insufficient or invalid power supply voltage (logic low) is detected, a logic low signal is used as a trigger of an enable signal generating circuit to generate the enable signal. The circuit dysfunction caused by an erroneous setting of the enable signal can be avoided by a precise control of the timing sequence. However, the logic level at an output terminal of the level-shifter circuit is restricted by the power supply voltage of the power domain in which the input signal exists. In particular, when the power supply voltage of the power domain in which the input signal exists is invalid, the logic level at the output terminal of the level-shifter circuit is always at a logic low, which brings inconveniences to the other circuits that are configured based on the logic level at the output terminal of the level-shifter circuit. Such level-shifter circuit may also be less practical.

Various embodiment of the present disclosure provides a level-shifter circuit including a latch unit and a level-shifting unit. The disclosed level-shifter circuit may satisfactorily solve the current leakage problems without external controlling of the enable signal. The disclosed level-shifter circuit provides desirable reliability.

Reference will now be made in detail to exemplary embodiments of the disclosure, which are illustrated in the accompanying drawings. Wherever possible, the same reference numbers will be used throughout the drawings to refer to the same or like parts.

Figure 3:
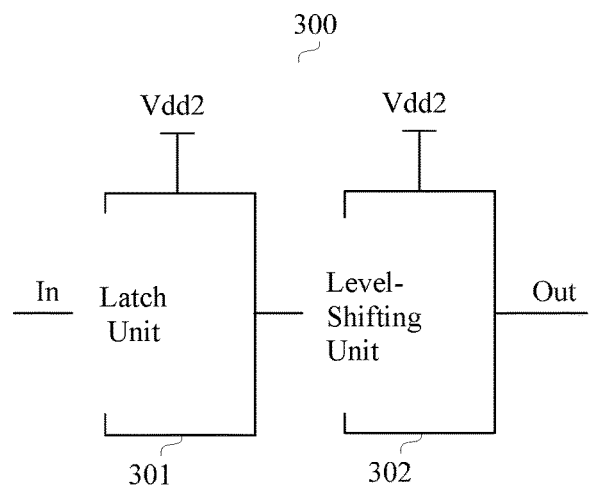
FIG. 3 is a schematic diagram of an exemplary level-shifter circuit according to various disclosed embodiments of the present disclosure.

FIG. 3 shows a level-shifter circuit 300 according to various embodiment of the present disclosure. The level-shifter circuit 300 includes a latch unit 301 and a level-shifting unit 302.

The latch unit 301 may be configured to receive a first digital signal (In) in a first power supply domain and latches the first digital signal (In) to obtain a latch signal (not labeled). The latch unit is powered by a power supply voltage (Vdd2) in a second power supply domain. In an embodiment, the latch unit 301 may include a bistable latch.

The level-shifting unit 302 may be configured to receive the latch signal and to shift the voltage of the latch signal to a second digital signal (Out) in the second power supply domain. The level-shifting unit 302 is powered by the power supply voltage (Vdd2) of the second power supply domain.

In an embodiment, when the first digital signal (In) is at a logic low, after being latched by the latch unit 301, the second digital signal (Out) generated by the level-shifting unit 302 is also logic low. The amplitude level of the first digital signal (In) may be equal to the second digital signal (Out). In one example, the amplitude level of both may be equal to a ground voltage.

When the first digital signal (In) is at a logic high, the amplitude level thereof may be equal to the power supply voltage of the first power supply domain, for example, about 1.2 V. The latch unit 301 latches its logic state, and the level-shifting unit 302 outputs the second digital signal (Out) at a logic high. The amplitude level of the second digital signal (Out) may be equal to the power supply voltage (Vdd2) of the second supply domain, for example, about 2.5 V. As a result, the level-shifting unit 302 shifts the amplitude level of the first digital signal (In) from a relatively low value to a relatively high value.

Similarly, in one embodiment, the level-shifting unit 302 can also shift the amplitude level of the first digital signal (In) from a relatively high value to a relatively low value, for example, from about 3.3V to about 1.8V. As such, the disclosed level-shifter circuit 300 can have a wide applicability by properly setting the power supply voltages of the first power supply domain and the second power supply domain.

In the level-shifter circuit 300, the logic state of the first digital signal (In) can be latched due to the bistable characteristic of the latch unit 301, and the latch unit 301 is powered by the power supply voltage (Vdd2) in the second power supply domain. In an embodiment, the power supply voltage (Vdd2) of the second power supply domain is independent of the power supply voltage of the first power supply domain. When the power supply voltage of the first power supply domain is invalid, the logic state of the latch signal outputted from the latch unit 301 may remain unchanged. As a result, the input terminal (or any circuit node in the circuit) of the level-shifting unit 302 will not have a floating voltage value or an undetermined state. Compared to the level-shifter circuit 100 shown in FIG. 1, there is no current leakage path in the level-shifter circuit 300. The additional power loss can be avoided.

Further, compared to the circuit diagram of the level-shifter circuit 200 shown in FIG. 2, the level-shifter circuit 300 does not need to introduce an external enable signal, and it is not necessary to manage the timing sequence of the enable signal. Thus, it can prevent circuit dysfunction caused by an erroneous setting of the enable signal. The level-shifter circuit 300 is easy to implement and has high reliability.

Furthermore, in the level-shifter circuit 300, the logic level of the second digital signal (Out) generated by the level-shifting unit 302 is determined by the output latch signal from the latch unit 301. Even if the power supply voltage of the first power supply domain for the first digital signal (In) is removed, the logic state of the latch signal from the latch unit 301 will not be affected. Therefore, unlike conventional level-shifter circuits, the level-shifter circuit 300 may have an output logic that is the same as its input logic, which conveniences the other circuits that are configured based on the logic level at the output terminal of the level-shifter circuit. Therefore, it has strong applicability.

Figure 4:
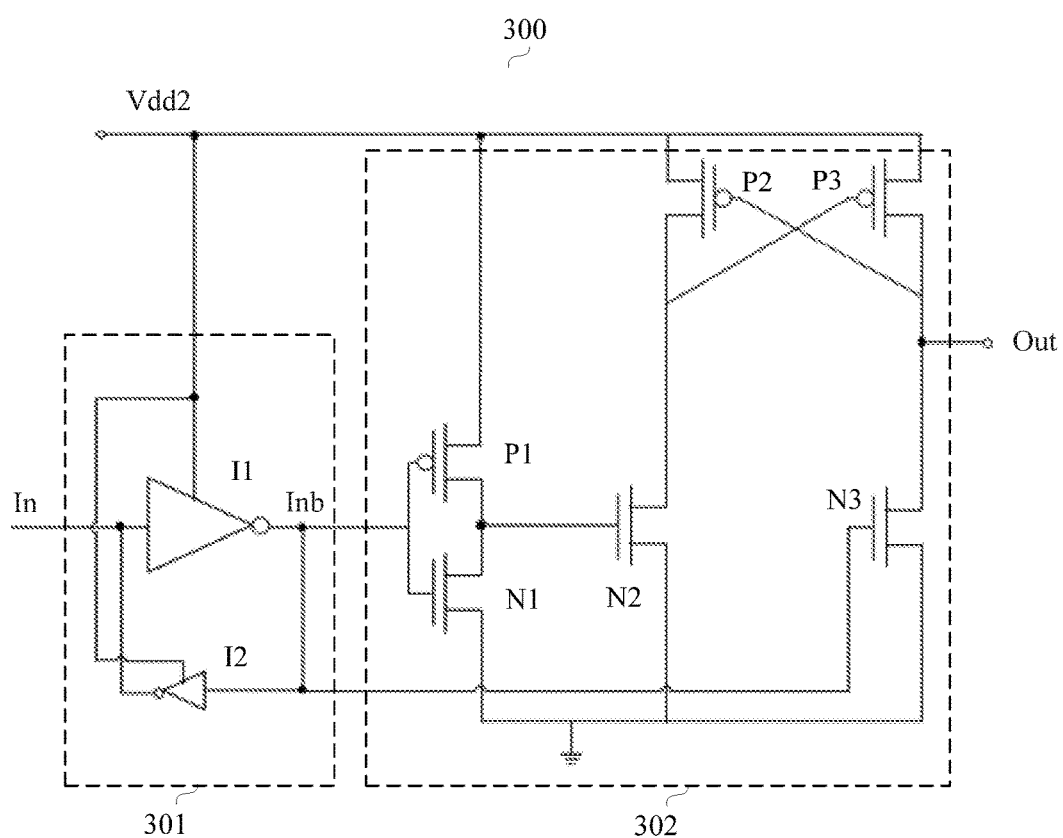
FIG. 4 is a circuit diagram of an exemplary level-shifter circuit according to various disclosed embodiments of the present disclosure.

FIG. 4 is a circuit diagram of an exemplary level-shifter circuit according to various disclosed embodiments of the present disclosure. As shown, the latch unit 301 may include a first inverter I1 and a second inverter I2.

An input terminal of the first inverter I1 receives the first digital signal (In) and an output terminal of the second inverter I2 outputs the latch signal. An input terminal of the second inverter I2 is coupled to the output terminal of the first inverter I1, and an output terminal of the second inverter I2 is coupled to the input terminal of the first inverter I1. The first inverter I1 and the second inverter I2 is powered by the power supply voltage (Vdd2) of the second power supply domain.

It should be noted that the latch unit 301 may be a bistable latch, including the first inverter I1 and the second inverter I2. In various embodiments, the latch unit 301 may be any other suitable latch circuits, as long as the latching of the digital logic can be realized. The latch unit is not particularly limited in the present disclosure.

As such, in one example, the power supply voltage (Vdd2) of the second power supply domain is higher than the power supply voltage of the first power supply domain. For example, the power supply voltage of the second power supply domain is 2.5 V, and the power supply voltage of the first power supply domain is 1.2 V.

When the power supply voltage (Vdd2) of the second power supply domain is higher than the power supply voltage of the first power supply domain, the level-shifting unit 302 may include a third inverter, a first switch, a second switch, a third switch and a fourth switch.

An input terminal of the third inverter receives the latch signal. In particular, the third inverter may include a first PMOS transistor P1 and a first NMOS transistor N1 (as shown in FIG. 4). Since the inverter is a conventional circuit configuration, for simplicity, no detailed description of the PMOS transistor P1 and the first NMOS transistor N1 is provided here. As an example, the drain of the first NMOS transistor N1 in the third inverter is grounded.

The first switch is turned on when its control terminal is at a logic high and is turned off when its control terminal is at a logic low. The control terminal is coupled to an output terminal of the third inverter. A first terminal of the first switch is grounded. In one embodiment, the first switch may be a semiconductor switching device, such as a MOS transistor or a triode, and may be a common switching element or an integrated switch encapsulated in a chip. The present disclosure is described using a second NMOS transistor N2 in FIG. 4 as an example for the first switch, but is not limited thereto.

The second switch is turned on when its control terminal is at a logic high and is turned off when its control terminal is at a logic low. The control terminal receives the latch signal, and a first terminal of the second switch is grounded. For example, the second switch may be a semiconductor switching device such as a MOS transistor or a triode or may be a common switching element or an integrated switch encapsulated in a chip. The present disclosure is described using a third NMOS transistor N3 in FIG. 4 as an example for the second switch, but is not limited thereto.

The third switch is turned on when its control terminal is at a logic low and is turned off when its control terminal is at a logic high. The control terminal is coupled to the second terminal of the second switch. A first terminal of the third switch is coupled to the first terminal of the first switch, and a second terminal of the third switch is coupled to the power supply voltage of the second power supply domain.

The fourth switch is turned when its control terminal is at a logic low and is turned off when its control terminal is at a logic high. The control terminal is coupled to the second terminal of the first switch. A first terminal of the fourth switch is coupled to the first terminal of the second switch, and a second terminal of the fourth switch is coupled to the power supply voltage of the second power supply domain.

In one embodiment, the third switch and the fourth switch may be a semiconductor switching device such as a MOS transistor or a triode and may be a common switching element or an integrated switch encapsulated in a chip. The present disclosure is described using a second PMOS transistor P2 in FIG. 4 as an example for the third switch, but is not limited thereto.

It should be noted that the level-shifting unit 302 is described, as an example, to include the third inverter, the first switch, the second switch, the third switch, and the fourth switch. However, any suitable circuit(s), that can realize the level-shifting function of the latch signal [e.g., the first digital signal (In)], may be used for the level-shifting unit, without limitation.

Figure 5:
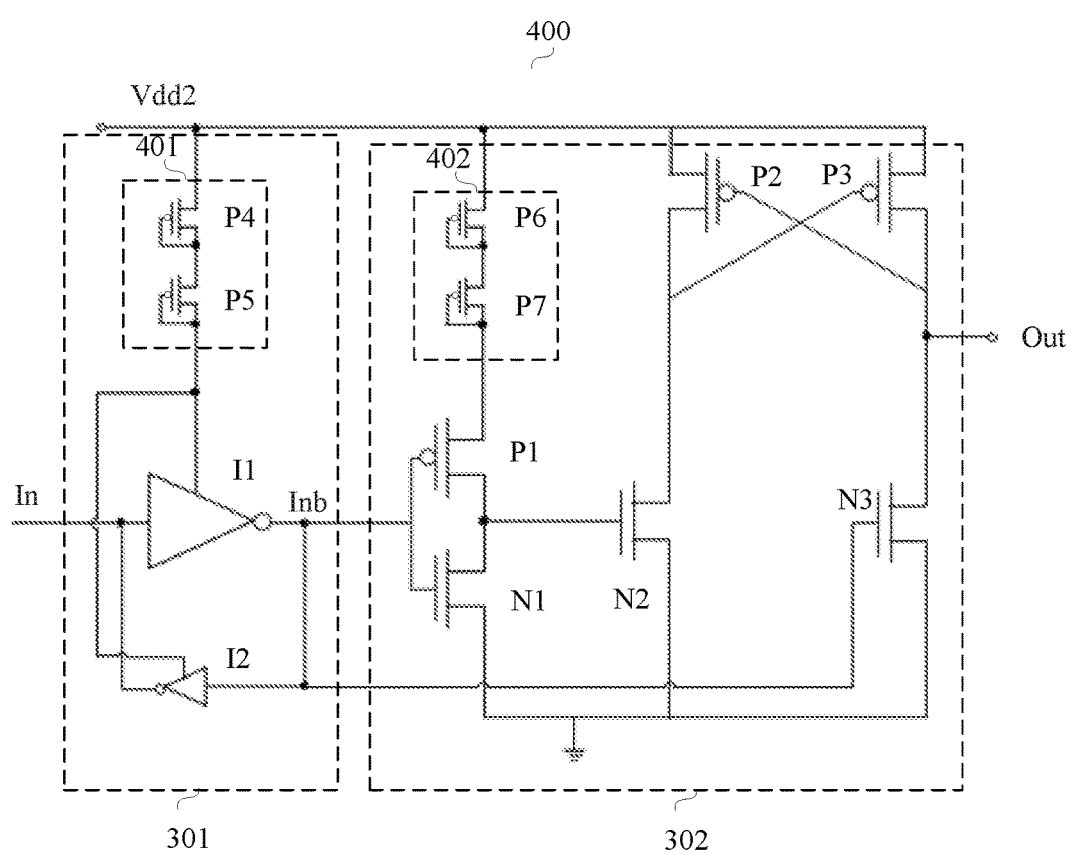
FIG. 5 is a circuit diagram of another exemplary level-shifter circuit according to various disclosed embodiments of the present disclosure.

FIG. 5 shows a level-shifter circuit 400 according to another exemplary embodiment of the present disclosure, and the structure and operation principle of the level-shifter circuit 400 are substantially the same as those of the level-shifter circuit 300 shown in FIG. 2. The main difference is that the latch unit 301 also includes a first voltage step-down unit 401 and/or the level-shifting unit 302 also includes a second voltage step-down unit 402.

Further, the first voltage step-down unit 401 is configured to reduce the power supply voltage (Vdd2) of the second power supply domain to provide a first step-down power supply voltage (not labeled). The first and second inverters are powered by the first step-down power supply.

The second voltage step-down unit 402 is configured to reduce the supply voltage (Vdd2) of the second power supply domain to provide a second step-down power supply voltage (not labeled). The second step-down power supply voltage is used for powering the third inverter.

The power supply voltage of the first power supply domain is different from the power supply voltage (Vdd2) of the second power supply domain and has a constant voltage difference. The power supply voltage (Vdd2) of the second power supply domain is stepped down and then is used to power the latch unit 301 and the level-shifting unit 302. This will make the logic level at the input terminals of the first inverter I1 and the second inverter I2 in the latch unit 301, and the third inverter in the level-shifting unit 302 to be compatible with the logic level of the input signals. Reliability of the circuits can thus be enhanced.

The first voltage step-down unit 401 and the second voltage step-down unit 402 may each include a circuit device or a combination of circuit devices that are capable of realizing voltage step-down, such as a MOS transistor, a triode, a resistor, a diode, or the like. Further, the voltage step-down for the power supply voltage (Vdd2) of the second power supply domain, which is provided by the first step-down unit 401 and the second step-down unit 402, depends on the voltage difference between the power supply voltage of the first power supply domain and the supply voltage (Vdd2) of the second power supply domain.

For example, the first step-down unit 401 and the second step-down unit 402 provide the same value of the step-down voltage to the power supply voltage (Vdd2) of the second power supply domain.

In one embodiment, the first voltage step-down unit 401 may include a fourth PMOS transistor P4 and a fifth PMOS transistor P5.

A source terminal of the fourth PMOS transistor P4 is connected to the power supply voltage (Vdd2) of the second power supply domain and a gate terminal of the fourth PMOS transistor P4 is coupled to its drain terminal.

A gate terminal of the fifth PMOS transistor P5 is coupled to its drain, and outputs the first step-down power supply voltage. A source terminal of the fifth PMOS transistor P5 is coupled to the drain terminal of the fourth PMOS transistor P4.

In one embodiment, the second voltage step-down unit 402 may include a sixth PMOS transistor P6 and a seventh PMOS transistor P7.

A source terminal of the sixth PMOS transistor P6 is connected to the power supply voltage of the second power supply domain, and a gate terminal of the sixth PMOS transistor P6 is coupled to its drain terminal.

A gate terminal of the seventh PMOS transistor P7 is coupled to its drain terminal. The seventh PMOS transistor P7 outputs the second step-down power supply voltage. A source terminal of the seventh PMOS transistor P7 is coupled to the drain terminal of the sixth NMOSN6 transistor.

The fourth PMOS transistor P4 and the fifth PMOS transistor P5 may provide a voltage difference of about 1.1 V for the power supply voltage (Vdd2) of the second power supply domain. The sixth PMOS transistor P6 and the seventh PMOS transistor P7 may also provide a voltage difference of about 1.1 V for the power supply voltage (Vdd2) in the second power supply domain, which may meet requirements of the level-shifter circuit 400.

Figure 6:
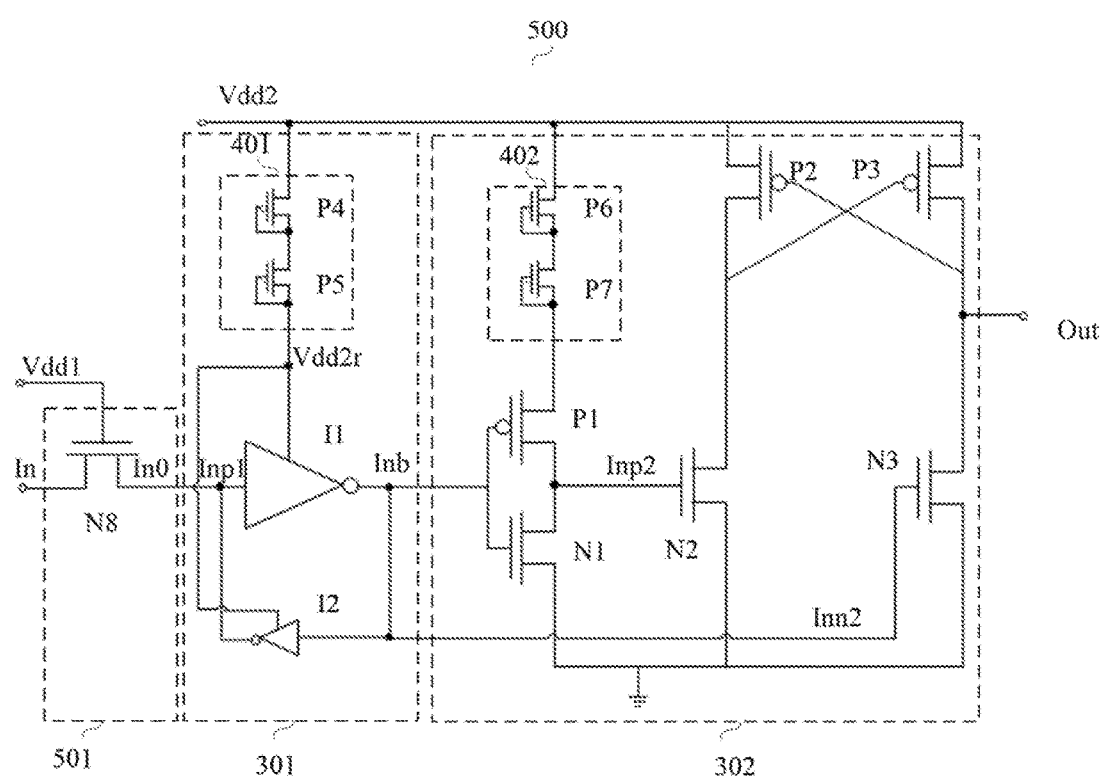
FIG. 6 is a circuit diagram of another exemplary level-shifter circuit according to various disclosed embodiments of the present disclosure.

FIG. 6 shows a level-shifter circuit 500 according to another exemplary embodiment of the present disclosure. The configuration and operation principle of the level-shifter circuit 500 may be substantially the same as those of the level-shifter circuit 400 shown in FIG. 5. The main difference is that the level-shifter circuit 500 may further include a signal detection unit 501.

Further, an input terminal of the signal detection unit 501 receives the first digital signal (In), and a control terminal of the signal detection unit 501 receives the power supply voltage (Vdd1) of the first power supply domain. When the control terminal of the signal detection unit 501 receives the power supply voltage (Vdd1) of the first power supply domain, the output terminal of the signal detection unit 501 transmits the first digital signal (In) to the latch unit 301. When the power supply voltage (Vdd1) of the first power supply domain is not received by the control terminal of the signal detection unit 501, the output terminal of the signal detection unit 501 cuts off the transmission of the first digital signal (In). That is, the signal detection unit 501 may electrically disconnect between the first digital signal (In) and the latch unit 301. When the power supply voltage (Vdd1) of the first power source field is valid, the signal detection unit 501 transmits the first digital signal (In) to the latch unit 301. When the power supply voltage (Vdd1) of the first power source field is powered off, the signal detection unit 501 cuts off the transmission of the first digital signal (In). The practicability of the circuit can be enhanced in this way.

In one embodiment, the signal detection unit 501 may include a fifth switch (not labeled). The fifth switch is configured to be turned on when a control terminal receives the power supply voltage (Vdd1) of the first power supply domain, and to be turned off when the power supply voltage (Vdd1) of the first power supply domain is powered off. The control terminal of the fifth switch is coupled to a control terminal of the signal detection unit 501. The first terminal of the fifth switch is coupled to an input terminal of the signal detection unit 501. The second terminal of the fifth switch is coupled to an output terminal of the signal detection unit 501.

The fifth switch may include an eighth NMOS transistor N8. A gate terminal of the eighth NMOS transistor N8 is connected to the power supply voltage (Vdd1) of the first power supply domain. The fifth switch may include an NMOS transistor, but is not limited thereto. For example, the fifth switch may include a PMOS transistor, a transfer gate, a triode, or a switching device other than a semiconductor switching device, or a switch chip.

It should be noted that the scheme of the level-shifter circuit 500 according to the exemplary embodiment of the present disclosure is applicable to the level-shifter circuits shown in FIGS. 3-4 of the present disclosure and will not be repeated herein.

Figure 7:
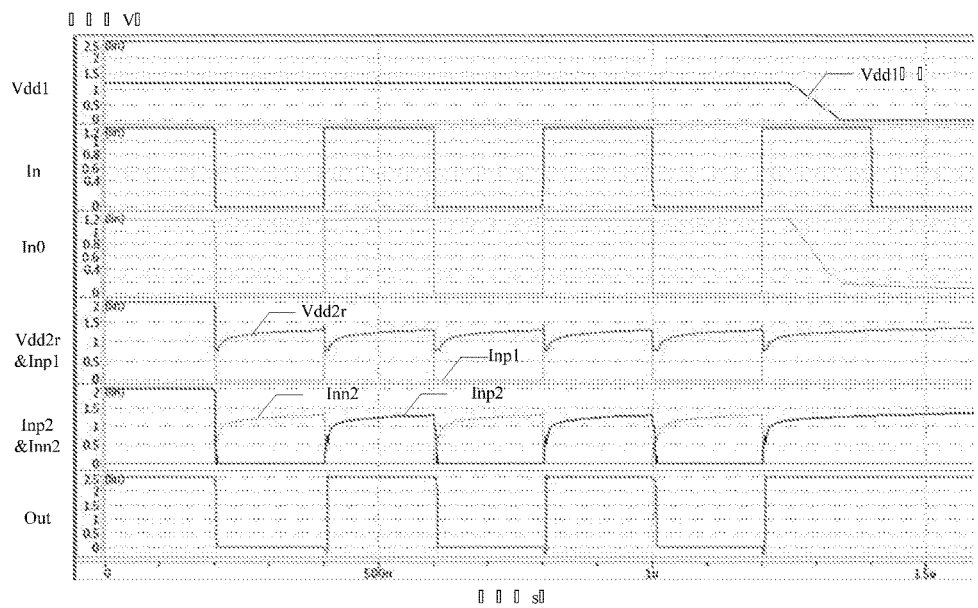
FIG. 7 is the simulation diagram of another exemplary level-shifter circuit according to various disclosed embodiments of the present disclosure.

FIG. 7 is a signal simulation diagram of all of the input and output nodes of the level-shifter circuit 500 according to another exemplary embodiment of the present disclosure.

In the level-shifter circuit 500, the power supply voltage (Vdd2) of the second power supply domain is 2.5 V, and the power supply voltage (Vdd1) of the first power supply domain is 1.2 V.

When the power supply voltage (Vdd1) of the first power supple domain is 1.2 V, the fifth switch transmits the first digital signal (In) and outputs through its second terminal. The output signal is represented by In0. As such, the fifth switch stops transmitting the first digital signal (In) when the power supply voltage (Vdd1) of the first power supply domain is invalid. The amplitude of the signal (In0) outputted from the second terminal of the fifth switch becomes 0V.

The first step-down voltage is represented by Vdd2$r$. The latch signals are represented by (Inp1) and (Inb), where the signal (Inp1) is the input signal to the first inverter I1, and the signal (Inb) is the output signal of the first inverter I1. The input signal at the gate terminal of the second NMOS transistor N2 is denoted as Inp2, and the input signal at the gate terminal of the third NMOS transistor N3 is denoted as Inn2.

As shown in FIG. 7, the first step-down power supply voltage (Vdd2$r$) is about 1.3 to 1.4 V. The logic level of the signal (Inp1) that inputs to the first inverter I1 is the same as for the first digital signal (In). The logic high level is determined by the first step-down power supply voltage (Vdd2$r$) and the logic level remains unchanged when the power supply voltage (Vdd1) of the first power supply domain is removed. The signal (Inp2) is an inverse logic level with the signal (Inn2). The level amplitude is determined by the second step-down power supply voltage, having a specific value with respect to the first step-down power supply voltage (Vdd2$r$). The logic level of the second digital signal (Out) is the same as that of the first digital signal (In). The logic high level is determined by the power supply voltage (Vdd2) of the second power supply domain, that is, the logic high level is 2.5V. When the power supply voltage (Vdd1) in the first power supply domain is removed, the logic level of the second digital signal (Out) is the same as that of the first digital signal (In) and remains unchanged.

Various embodiments may also provide a method for using the disclosed level-shifter circuit. In an exemplary method, a latch unit in a level-shifter circuit may be used to generate a latch signal to store a logic state of a first digital signal in a first power supply domain. A level-shifting unit in the level-shifter circuit may be used to shift a voltage of the latch signal to output a second digital signal in a second power supply domain. The latch unit and the level-shifting unit may be powered by a power supply voltage in a second power supply domain. By using the disclosed level-shifter circuit, current leakage may be automatically reduced especially when a supply voltage is invalid, and auto power gating function may be provided.

In one embodiment, the method may further include latching a previous logic level of the first digital signal before the first power supply in the first power supply domain is removed; generating an output signal of the level-shifter in response to the previous logic level of the first digital signal before the first power supply is removed; and/or electrically disconnecting the first digital signal to the level-shifter when the first power supply voltage is removed.

In some embodiments, the power supply voltage in the second power supply domain is greater than a power supply voltage in the first power supply domain.

In some embodiments, the latch unit may include a first inverter, having an input terminal configured to receive the first digital signal and an output terminal configured to output the latch signal; and a second inverter, having an input terminal coupled to the output terminal of the first inverter and an output terminal coupled to the input terminal of the first inverter. The first and second inverters are powered by the power supply voltage in the second power supply domain.

In some embodiments, the latch unit may further include: a first voltage step-down unit configured to reduce the power supply voltage in the second power supply domain to provide a first step-down power supply voltage, wherein the first step-down power supply voltage is configured to power the first and second inverters. The first voltage step-down unit may include a first PMOS transistor, having a source terminal connected to the power supply voltage of the second power supply domain, a gate terminal, and a drain terminal coupled to the gate terminal; and a second PMOS transistor, having a gate terminal coupled to a drain terminal thereof to output the first step-down power supply voltage and a source terminal coupled to the drain terminal of the first PMOS transistor.

In some embodiments, the level-shifting unit may include a third inverter, a first switch, a second switch, a third switch, and a fourth switch.

The third inverter may have an input terminal configured to receive the latch signal.

The first switch may have a control terminal and may be configured to turn on in response to a logic high at the control terminal and to turn off in response to a logic low at the control terminal. The control terminal may be coupled to an output terminal of the third inverter and a first terminal of the first switch is grounded.

The second switch may have a control terminal and may be configured to turn on in response to a logic high at the control terminal and turn off in response to a logic low at the control terminal. The control terminal may receive the latch signal and a first terminal of the second switch is grounded;

The third switch may have a control terminal and may be configured to turn on in response to a logic low at the control terminal and turn off in response to a logic high at the control terminal. The control terminal may be coupled to a second terminal of the second switch. A first terminal of the third switch may be coupled to the first terminal of the first switch. A second terminal of the third switch may be coupled to the power supply voltage in the second power supply domain.

The fourth switch may have a control terminal and may be configured to turn on in response to a logic low at the control terminal and turn off in response to a logic high at the control terminal. The control terminal may be coupled to a second terminal of the first switch. A first terminal of the fourth switch may be coupled to the first terminal of the second switch. A second terminal of the fourth switch may be coupled to the power supply voltage in the second power supply domain.

In some embodiments, the level-shifting unit may further include a second voltage step-down unit, configured to reduce the power supply voltage in the second power supply domain to provide a second step-down power supply voltage, wherein the second step-down power supply voltage is configured to power the third inverter.

In some embodiments, the second voltage step-down unit may include a third PMOS transistor, having a source terminal connected to the power supply voltage of the second power supply domain and a gate terminal coupled to a drain terminal thereof; and a fourth PMOS transistor, having a gate terminal coupled to a drain terminal thereof to output the first step-down power supply voltage and a source terminal coupled to the drain terminal of the third PMOS transistor.

In some embodiments, the level-shifter circuit may further include a signal detection unit, having an input terminal receive the first digital signal, and having a control terminal receive the power supply voltage of the first power supply domain. An output terminal of the signal detection unit may transmit the first digital signal to the latch unit, when the control terminal receives the power supply voltage of the first power supply domain. The output terminal may cut off the transmission of the first digital signal, when the power supply voltage of the first power supply domain is not received by the control terminal of the signal detection unit.

In some embodiments, the signal detection unit may further include a fifth switch, having a control terminal configured to turn on when the control terminal receives the power supply voltage of the first power supply domain, and configured to turn off when the power supply voltage of the first power supply domain is powered off. The control terminal of the fifth switch may be coupled to the control terminal of the signal detection unit. The first terminal of the fifth switch may be coupled to the input terminal of the signal detection unit. A second terminal of the fifth switch may be coupled to the output terminal of the signal detection unit.

Unlike conventional level-shifter circuit, the disclosed level-shifter circuit may include, for example, at least a latch unit and a level-shifter unit. The latch unit may receive a first digital signal in a first power supply domain and latch the first digital signal to obtain a latch signal. The latch unit may be powered by a power supply voltage of a second power supply domain. The level-shifter unit may receive the latch signal and shift the latch signal to output a second digital signal in the second power supply domain. The level-shifter unit may be powered by the power supply voltage of the second power source domain. The logic state of the first digital signal can be latched due to the bistable characteristic of the latch unit.

In a specific embodiment, the latch unit may be powered by the power supply voltage of the second power domain. The power supply voltage of the second power source is independent from the first power supply domain. That is, when the power supply voltage of the first power supply domain is invalid, the logic state of the latch signal outputted from the latch unit may remain unchanged. As a result, the input terminal of the level-shifting unit will not have a floating voltage value or an undetermined state. Compared to the conventional circuits and methods, there is no current leakage path in the level-shifter circuit according to the embodiments of the present disclosure. The additional power loss can be avoided and the logic state of the output signal will remain unchanged when the power supply voltage of the first power supply domain is removed.

Further, the latch unit may further include a first voltage step-down unit configured to reduce the power supply voltage of the second power supply domain to obtain a first step-down power supply voltage. The first step-down power supply may supply power to a first inverter and a second inverter. The level-shifter unit may further include a second voltage step-down unit configured to reduce the power supply voltage of the second power supply domain to obtain a second step-down power supply voltage. The second step-down power supply may supply power to a third inverter. Compatibility with the logic level and reliability of the circuits can thus be enhanced.

Further, the level-shifter circuit according to various embodiments of the present disclosure may further include a signal detection unit configured to detect the first digital signal. When the power supply voltage of the first power supply domain is valid, the signal detection unit transmits the first digital signal to the latch unit. When the power supply voltage of the first power supply domain is turned off, the signal detection unit cuts off the transmission of the first digital signal. The signal detection unit may provide a blocking function for the first digital signal and enhance the circuit practicability.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A level-shifter circuit, comprising:
    a latch unit, configured to generate a latch signal for storing a logic state of a first digital signal in a first power supply domain;
    a signal detection unit, having an input terminal receive the first digital signal, and having a control terminal receive a power supply voltage of the first power supply domain, wherein:
        an output terminal of the signal detection unit transmits the first digital signal to the latch unit, when the control terminal receives the power supply voltage of the first power supply domain, and
        the output terminal cuts off the transmission of the first digital signal, when the power supply voltage of the first power supply domain is not received by the control terminal of the signal detection unit; and
    a level-shifting unit, configured to shift a voltage of the latch signal to output a second digital signal in a second power supply domain, wherein
        the latch unit and the level-shifting unit are powered by a power supply voltage in the second power supply domain, and
        the power supply voltage in the second power supply domain is greater than the power supply voltage in the first power supply domain.

2. The level-shifter circuit according to claim 1, wherein the latch unit comprises:
    a first inverter, having an input terminal configured to receive the first digital signal and an output terminal configured to output the latch signal; and
    a second inverter, having an input terminal coupled to the output terminal of the first inverter and an output terminal coupled to the input terminal of the first inverter,
    wherein the first and second inverters are powered by the power supply voltage in the second power supply domain.

3. The level-shifter circuit according to claim 2, wherein the latch unit further comprises:
    a first voltage step-down unit configured to reduce the power supply voltage in the second power supply domain to provide a first step-down power supply voltage, wherein the first step-down power supply voltage is configured to power the first and second inverters.

4. The level-shifter circuit according to claim 3, wherein the first voltage step-down unit comprises:
    a first PMOS transistor, having a source terminal connected to the power supply voltage of the second power supply domain, a gate terminal, and a drain terminal coupled to the gate terminal; and
    a second PMOS transistor, having a gate terminal coupled to a drain terminal thereof to output the first step-down power supply voltage and a source terminal coupled to the drain terminal of the first PMOS transistor.

5. The level-shifter circuit according to claim 1, wherein the signal detection unit further comprises:
    a fifth switch, having a control terminal configured to turn on when the control terminal receives the power supply voltage of the first power supply domain, and configured to turn off when the power supply voltage of the first power supply domain is powered off, wherein:
    the control terminal of the fifth switch is coupled to the control terminal of the signal detection unit,
    the first terminal of the fifth switch is coupled to the input terminal of the signal detection unit, and
    a second terminal of the fifth switch is coupled to the output terminal of the signal detection unit.

6. A level-shifter circuit, comprising:
    a latch unit, configured to generate a latch signal for storing a logic state of a first digital signal in a first power supply domain; and
    a level-shifting unit, configured to shift a voltage of the latch signal to output a second digital signal in a second power supply domain, wherein:
    the latch unit and the level-shifting unit are powered by a power supply voltage in the second power supply domain,
    the power supply voltage in the second power supply domain is greater than a power supply voltage in the first power supply domain, and
    the level-shifting unit comprises:
        a third inverter, having an input terminal configured to receive the latch signal;
        a first switch, having a control terminal and configured to turn on in response to a logic high at the control terminal and to turn off in response to a logic low at the control terminal, wherein the control terminal is coupled to an output terminal of the third inverter and a first terminal of the first switch is grounded;
        a second switch, having a control terminal and configured to turn on in response to a logic high at the control terminal and turn off in response to a logic low at the control terminal, wherein the control terminal receives the latch signal and a first terminal of the second switch is grounded;
        a third switch, having a control terminal and configured to turn on in response to a logic low at the control terminal and turn off in response to a logic high at the control terminal, wherein the control terminal is coupled to a second terminal of the second switch, a first terminal of the third switch is coupled to the first terminal of the first switch, and a second terminal of the third switch is coupled to the power supply voltage in the second power supply domain; and
        a fourth switch, having a control terminal and configured to turn on in response to a logic low at the control terminal and turn off in response to a logic high at the control terminal, wherein the control terminal is coupled to a second terminal of the first switch, a first terminal of the fourth switch is coupled to the first terminal of the second switch, and a second terminal of the fourth switch is coupled to the power supply voltage in the second power supply domain.

7. The level-shifter circuit according to claim 6, wherein the level-shifting unit further comprises:
a second voltage step-down unit, configured to reduce the power supply voltage in the second power supply domain to provide a second step-down power supply voltage, wherein the second step-down power supply voltage is configured to power the third inverter.

8. The level-shifter circuit according to claim 7, wherein the second voltage step-down unit comprises:
a third PMOS transistor, having a source terminal connected to the power supply voltage of the second power supply domain and a gate terminal coupled to a drain terminal thereof; and
a fourth PMOS transistor, having a gate terminal coupled to a drain terminal thereof to output the first step-down power supply voltage and a source terminal coupled to the drain terminal of the third PMOS transistor.

9. The level-shifter circuit according to claim 6, wherein the latch unit comprises:
a first inverter, having an input terminal configured to receive the first digital signal and an output terminal configured to output the latch signal; and
a second inverter, having an input terminal coupled to the output terminal of the first inverter and an output terminal coupled to the input terminal of the first inverter,
wherein the first and second inverters are powered by the power supply voltage in the second power supply domain.

10. The level-shifter circuit according to claim 6, wherein the latch unit further comprises:
a first voltage step-down unit configured to reduce the power supply voltage in the second power supply domain to provide a first step-down power supply voltage, wherein the first step-down power supply voltage is configured to power the first and second inverters.

11. A method for using a level-shifter circuit, comprising:
generating, by a latch unit, a latch signal to store a logic state of a first digital signal in a first power supply domain;
detecting, by a signal detection unit, a power supply voltage of the first power supply domain, the signal detection unit having an input terminal receive the first digital signal, and having a control terminal receive the power supply voltage of the first power supply domain, wherein:
an output terminal of the signal detection unit transmits the first digital signal to the latch unit, when the control terminal receives the power supply voltage of the first power supply domain, and
the output terminal cuts off the transmission of the first digital signal, when the power supply voltage of the first power supply domain is not received by the control terminal of the signal detection unit; and
shifting, by a level-shifting unit, a voltage of the latch signal to output a second digital signal in a second power supply domain, wherein the latch unit and the level-shifting unit are powered by a power supply voltage in the second power supply domain, and the power supply voltage in the second power supply domain is greater than the power supply voltage in the first power supply domain.

12. The method according to claim 11, wherein the latch unit comprises:
a first inverter, having an input terminal configured to receive the first digital signal and an output terminal configured to output the latch signal; and
a second inverter, having an input terminal coupled to the output terminal of the first inverter and an output terminal coupled to the input terminal of the first inverter,
wherein the first and second inverters are powered by the power supply voltage in the second power supply domain.

13. The method according to claim 12, wherein the latch unit further comprises:
a first voltage step-down unit configured to reduce the power supply voltage in the second power supply domain to provide a first step-down power supply voltage, wherein the first step-down power supply voltage is configured to power the first and second inverters.

14. The method according to claim 13, wherein the first voltage step-down unit comprises:
a first PMOS transistor, having a source terminal connected to the power supply voltage of the second power supply domain, a gate terminal, and a drain terminal coupled to the gate terminal; and
a second PMOS transistor, having a gate terminal coupled to a drain terminal thereof to output the first step-down power supply voltage and a source terminal coupled to the drain terminal of the first PMOS transistor.

15. The method according to claim 11, wherein the level-shifting unit comprises:
a third inverter, having an input terminal configured to receive the latch signal;
a first switch, having a control terminal and configured to turn on in response to a logic high at the control terminal and to turn off in response to a logic low at the control terminal, wherein the control terminal is coupled to an output terminal of the third inverter and a first terminal of the first switch is grounded;
a second switch, having a control terminal and configured to turn on in response to a logic high at the control terminal and turn off in response to a logic low at the control terminal, wherein the control terminal receives the latch signal and a first terminal of the second switch is grounded;
a third switch, having a control terminal and configured to turn on in response to a logic low at the control terminal and turn off in response to a logic high at the control terminal, wherein the control terminal is coupled to a second terminal of the second switch, a first terminal of the third switch is coupled to the first terminal of the first switch, and a second terminal of the third switch is coupled to the power supply voltage in the second power supply domain; and
a fourth switch, having a control terminal and configured to turn on in response to a logic low at the control terminal and turn off in response to a logic high at the control terminal, wherein the control terminal is coupled to a second terminal of the first switch, a first terminal of the fourth switch is coupled to the first terminal of the second switch, and a second terminal of the fourth switch is coupled to the power supply voltage in the second power supply domain.

16. The method according to claim 15, wherein the level-shifting unit further comprises:
- a second voltage step-down unit, configured to reduce the power supply voltage in the second power supply domain to provide a second step-down power supply voltage, wherein the second step-down power supply voltage is configured to power the third inverter.

17. The method according to claim 16, wherein the second voltage step-down unit comprises:
- a third PMOS transistor, having a source terminal connected to the power supply voltage of the second power supply domain and a gate terminal coupled to a drain terminal thereof; and
- a fourth PMOS transistor, having a gate terminal coupled to a drain terminal thereof to output the first step-down power supply voltage and a source terminal coupled to the drain terminal of the third PMOS transistor.

18. The method according to claim 11, wherein the signal detection unit further comprises:
- a fifth switch, having a control terminal configured to turn on when the control terminal receives the power supply voltage of the first power supply domain, and configured to turn off when the power supply voltage of the first power supply domain is powered off, wherein:
- the control terminal of the fifth switch is coupled to the control terminal of the signal detection unit,
- the first terminal of the fifth switch is coupled to the input terminal of the signal detection unit, and
- a second terminal of the fifth switch is coupled to the output terminal of the signal detection unit.

* * * * *